United States Patent
Liu

(10) Patent No.: US 11,863,195 B2
(45) Date of Patent: Jan. 2, 2024

(54) ANALOG-TO-DIGITAL CONVERTER DEVICE AND METHOD CAPABLE OF ADJUSTING BIT CONVERSION CYCLE OF ANALOG-TO-DIGITAL CONVERSION OPERATION

(71) Applicant: PixArt Imaging Inc., Hsin-Chu (TW)

(72) Inventor: Shiue-Shin Liu, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 107 days.

(21) Appl. No.: 17/574,583

(22) Filed: Jan. 13, 2022

(65) Prior Publication Data

US 2023/0223945 A1    Jul. 13, 2023

(51) Int. Cl.
  *H03M 1/06* (2006.01)
  *H03M 1/38* (2006.01)
  *H03M 1/46* (2006.01)
  *H03M 1/40* (2006.01)

(52) U.S. Cl.
  CPC .......... *H03M 1/0604* (2013.01); *H03M 1/38* (2013.01); *H03M 1/40* (2013.01); *H03M 1/46* (2013.01); *H03M 1/462* (2013.01)

(58) Field of Classification Search
  CPC ........ H03M 1/0604; H03M 1/38; H03M 1/40; H03M 1/46; H03M 1/462; H03M 1/466
  USPC .......................................... 341/118, 163, 172
  See application file for complete search history.

(56) References Cited

U.S. PATENT DOCUMENTS 9,685,973 B2 *  6/2017  Liu ......................... H03M 1/38
9,755,657 B2 *  9/2017  Baek ..................... H03M 1/466

* cited by examiner

*Primary Examiner* — Khai M Nguyen
(74) *Attorney, Agent, or Firm* — Winston Hsu

(57) ABSTRACT

An ADC device includes a DAC circuit, a comparator circuit, a SAR decision circuit, an oscillator circuit having a delay unit, and a processing circuit. The oscillator circuit is used for generating the clock signal according to a reset signal and a delay of the delay unit. The processing circuit is used for sequentially generating multiple bit conversion signals associated with multiple different bits of the decision signal, for generating at least one guard signal which follows the multiple bit conversion signals, and then for comparing the at least one guard signal with the reset signal to adjust the delay generated by the delay unit of the oscillator circuit.

12 Claims, 6 Drawing Sheets

ANALOG-TO-DIGITAL CONVERTER DEVICE AND METHOD CAPABLE OF ADJUSTING BIT CONVERSION CYCLE OF ANALOG-TO-DIGITAL CONVERSION OPERATION

BACKGROUND OF THE INVENTION

1. Field of the Invention

The invention relates to an analog-to-digital conversion operation, and more particularly an analog-to-digital converter device and the method.

2. Description of the Prior Art

Generally speaking, a conventional analog-to-digital conversion method employs an oscillator to trigger the operation of circuit component(s) within a conventional analog-to-digital conversion device. However, the process variation, the voltage variation, and/or the temperature variation may affect the frequency of the clock signal generated by the oscillator, and inevitably the performance of the component (s) of the conventional analog-to-digital conversion device is degraded.

SUMMARY OF THE INVENTION

Therefore one of the objectives of the invention is to provide an analog-to-digital converter (ADC) device, to solve the above-mentioned problems.

According to embodiments of the invention, an analog-to-digital converter (ADC) device is disclosed. The ADC device comprises a digital-to-analog converter (DAC) circuit, a comparator circuit, a SAR decision circuit, an oscillator circuit having a delay unit, and a processing circuit. The DAC circuit has an input coupled to an input voltage signal and has an output coupled to the comparator circuit, and it is used for generating a DAC voltage signal according to the input voltage signal according to a decision signal transmitted from the SAR decision circuit. The comparator circuit has an input coupled to the DAC circuit, an output coupled to the SAR decision circuit, and a clock input coupled to a clock signal generated by the oscillator circuit, and it is used for generating a comparison signal into the SAR decision circuit according to the DAC voltage signal. The SAR decision circuit is used for generating the decision signal. The oscillator circuit is coupled to the comparator circuit, and it is used for generating the clock signal according to a reset signal and a delay of the delay unit. The processing circuit is coupled to the oscillator circuit and the SAR decision circuit, and it is used for sequentially generating multiple bit conversion signals associated with multiple different bits of the decision signal, for generating at least one guard signal which follows the multiple bit conversion signals, and then for comparing the at least one guard signal with the reset signal to adjust the delay generated by the delay unit of the oscillator circuit.

According to the embodiments, a method of an analog-to-digital converter (ADC) device is disclosed. The method comprises: providing a digital-to-analog converter (DAC) circuit, the DAC circuit having an input coupled to an input voltage signal and having an output coupled to a comparator circuit; generating a DAC voltage signal according to the input voltage signal according to a decision signal transmitted from a successive approximation register (SAR) decision circuit; providing the comparator circuit, the comparator circuit having an input coupled to the DAC circuit, an output coupled to the SAR decision circuit, and a clock input coupled to a clock signal generated by an oscillator circuit; generating a comparison signal into the SAR decision circuit according to the DAC voltage signal; using the SAR decision circuit to generate the decision signal; using the oscillator circuit to generate the clock signal according to a reset signal and a delay of the delay unit; sequentially generating multiple bit conversion signals associated with multiple different bits of the decision signal; generating at least one guard signal which follows the multiple bit conversion signals; and, comparing the at least one guard signal with the reset signal to adjust the delay generated by the delay unit of the oscillator circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
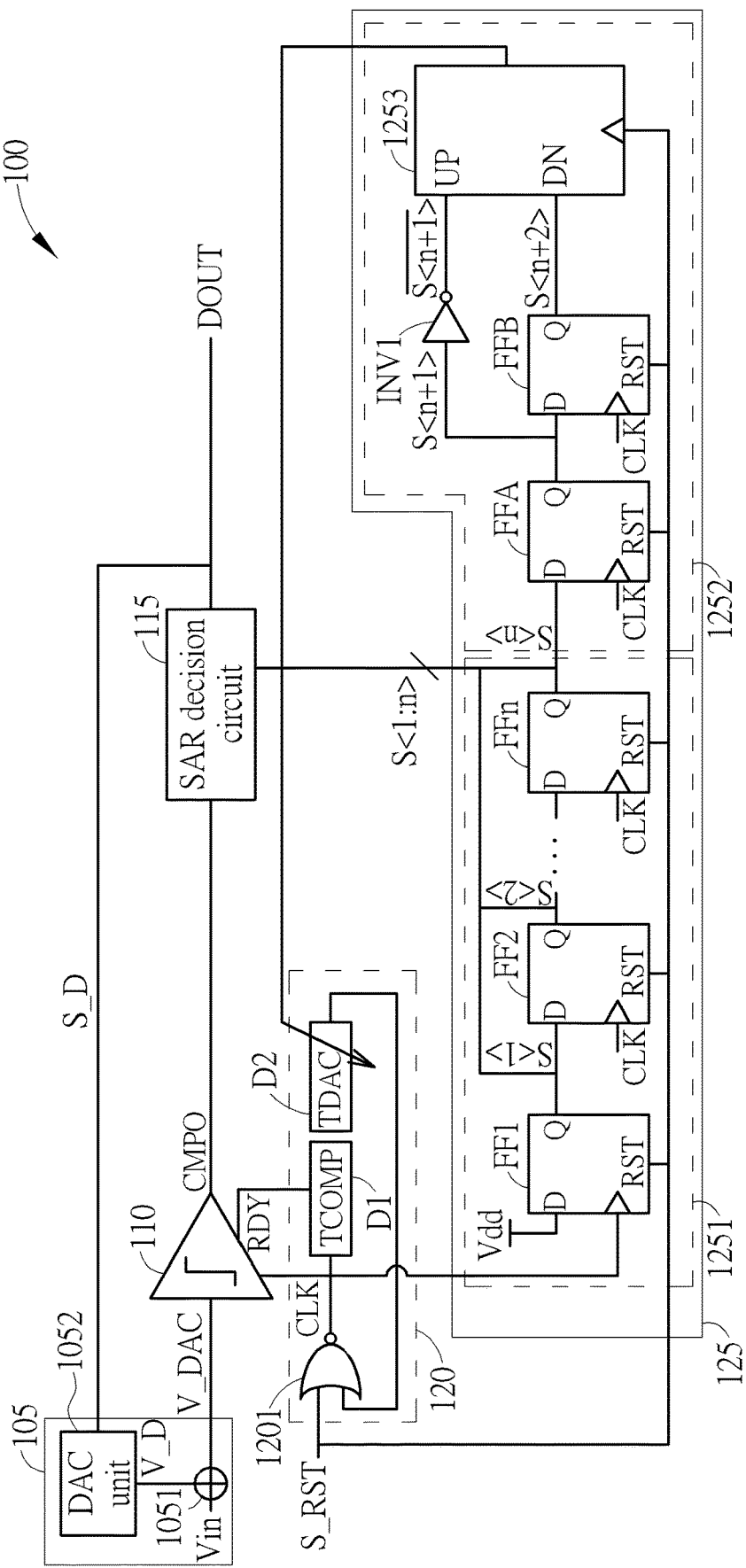
FIG. 1 is a diagram of an analog-to-digital converter (ADC) device according to an embodiment of the invention.

FIG. 1 is a diagram of an analog-to-digital converter (ADC) device 100 according to an embodiment of the invention. As shown in FIG. 1, the ADC device 100 comprises a digital-to-analog converter (DAC) circuit 105, a comparator circuit 110, a successive approximation register (SAR) decision circuit 115 which operates based on the SAR algorithm, an oscillator circuit 120 having at least one delay unit, and a processing circuit 125. The ADC device 100 for example (but not limited) is an asynchronous SAR ADC circuit device, and it is used for perform an ADC conversion operation to convert an input voltage signal Vin in analog domain into a digital output signal (or a digital code) DOUT having multiple output bits such as n bits in digital domain so as to generate and output the digital output signal DOUT at its output terminal; the input voltage signal Vin which is feed into the input terminal of the ADC device 100.

In practice, the DAC circuit 105 for example (but not limited) comprises a subtractor 1051 and a DAC unit 1052. The DAC circuit 105 has an input and an output, its input is coupled to the input voltage signal Vin to receive such input voltage signal Vin, and its output is coupled to the comparator circuit 110.

The comparator circuit 110 has an input coupled to the DAC circuit 105, an output coupled to the SAR decision circuit 115, and a clock input coupled to a clock signal CLK generated by the oscillator circuit 120.

The oscillator circuit 120 is coupled to the comparator circuit 110, and it is used for generating the clock signal CLK according to the reset signal S_RST and a delay of the delay unit which is comprised by the oscillator circuit 120. For example (but not limited), it may be a ring oscillator which may comprise a NOR gate logic 1201 and at least one delay unit such as delay units D1 and D2. The delay unit D1 is arranged to delay the clock signal with a delay time/amount TCOMP, and the delay unit D2 is arranged to delay the output of delay unit D1 with a delay time/amount TDAC. The delay time/amount TCOMP is associated with a time period consumed by the voltage comparison operation of comparator circuit 110, and the delay time/amount TDAC is associated with an adjustable time period of DAC settling which can be controlled by the processing circuit 125. The clock signal CLK, generated by the oscillator circuit 120, is provided for the comparator circuit 110 and the processing circuit 125.

The processing circuit 125 is coupled to the oscillator circuit 120 and the SAR decision circuit 115, and it for example (but not limited) comprises a delay stage circuit 1251 and a delay-locked-loop (DLL) control circuit 1252. The delay stage circuit 1251 for example comprises a plurality of flip-flops FF1, FF2, . . . , and FFn which are connected in series. The DLL control circuit 1252 for example comprises a first flip-flop FFA, a second flip-flop FFB, an inverter INV1, and an up/down counter 1253.

A time period of an ADC conversion operation provided by the ADC device 100 may comprise multiple bit conversion/decision cycles such as n cycles respectively associated with n bits, and during each bit conversion cycle the SAR decision circuit 115 is arranged to determine the content of a corresponding bit according to the comparison signal CMPO currently outputted by the comparator circuit 110 and then to update the decision signal S_D based on the determine corresponding bit. The delay stage circuit 1251 is arranged for sequentially generating the multiple bit conversion signals S<1>, S<1>, . . . , and S<n> (i.e. S<1:n>) to the SAR decision circuit 115 according to the reset signal S_RST and the clock signal CLK, so that the SAR decision circuit 115 can start a corresponding bit decision in response to a signal transition occurring in a specific bit conversion signal.

For example, the SAR decision circuit 115 may start a bit decision of the most significant bit (MSB) in response to a signal transition (e.g. a rising edge) occurring in the bit conversion signal S<1>. Similarly, the SAR decision circuit 115 may start a bit decision of the least significant bit (LSB) in response to a signal transition (e.g. a rising edge) occurring in the bit conversion signal S<n>. That is, the multiple bit conversion signals S<1>, S<1>, . . . , and S<n> are respectively associated with the multiple different bits of the decision signal S_D. In addition, the bit conversion signal S<n> is further transmitted to the DLL control circuit 1252.

The DLL control circuit 1252 is coupled to the delay stage circuit 1251 and the oscillator circuit 120, and it is used for generating at least one guard signal by delaying a last bit conversion signal, i.e. the bit conversion signal S<n>, for at least one time, comparing the at least one guard signal with the reset signal S_RST to generate a control signal S_C, and for controlling the adjustable delay time/amount TDAC generated by the delay unit D2 of the oscillator circuit 120 according to the control signal S_C. The at least one guard signal follows the multiple bit conversion signals S<1>, S<1>, . . . , and S<n>. By using the delay stage circuit 1251 and DLL control circuit 1252, the processing circuit 125 can control the delay unit D2 generating/adjusting the enough and appropriate delay time/amount TDAC to make each bit conversion cycle be enough and appropriate even though the ring oscillator circuit 120 may actually run too fast or too slow due to the process variation, the voltage variation, and/or the temperature variation made to any component (s) comprised within the ADC device 100. The corresponding operations are detailed later.

For the ADC conversion operation to convert the input voltage signal Vin into the digital signal DOUT having n bits, the DAC circuit 105 is used for generating the DAC voltage signal V_DAC (i.e. an analog signal) according to the input voltage signal Vin and the decision signal S_D (a digital decision signal) transmitted from the SAR decision circuit 115. The digital decision signal S_D for example comprises multiple bits such as n bits. The DAC unit 1052 is arranged to perform the DAC operation to convert the digital decision signal S_D into an analog decision voltage signal V_D and output the analog decision voltage signal V_D into a second input of the subtractor 1051. The subtractor 1051 has a first input coupled to the input voltage signal Vin, the second input coupled to the analog decision voltage signal V_D, and an output, and it is used to subtract the analog decision voltage signal V_D from the input voltage signal Vin to generate the DAC voltage signal V_DAC at its output as the DAC circuit's 105 analog output into the comparator circuit 110.

The comparator circuit 110 is used to compare the DAC voltage signal V_DAC with a reference level such as a ground level (but not limited) to generate the comparison signal CMPO into the SAR decision circuit according to the DAC voltage signal V_DAC. That is, the comparison signal CMPO can indicate whether the level of the DAC voltage signal V_DAC is greater than the reference level or not. Then, based on the SAR algorithm, the SAR decision circuit 115 updates the bit (s) of the decision signal S_D (i.e. digital output signal DOUT) based on the information indicated by the comparison signal CMPO. The SAR decision circuit 115 may sequentially decide or determine each bit of the decision signal S_D (i.e. digital output signal DOUT) from the MSB bit to the LSB bit.

For instance (but not limited), the decision signal S_D initially may have n bits '0', and the SAR decision circuit 115 at the first bit conversion cycle is arranged to determine the MSB bit of the decision signal S_D to generate/update the decision signal S_D. If the comparison signal CMPO indicates that the level of the DAC voltage signal V_DAC is greater than the reference level, then the SAR decision circuit 115 determines that the MSB bit is equal to '1', and the decision signal S_D is updated as '1' followed by (N−1) bits '0'. Each time when determining a different bit, the SAR decision circuit 115 updates the outputted decision signal S_D.

Based on the feedback circuit structure in FIG. 1, after the n bit conversion cycles are sequentially finished, the ADC conversion operation can output the decision signal S_D as the digital output signal DOUT converted from the input voltage signal Vin.

In this embodiment, the comparator circuit 110 performs the comparison operation each time when receiving a signal transition of the clock signal CLK generated from oscillator circuit 120; that clock signal CLK triggers the comparator circuit 110.

For the clock signal CLK, when the oscillator circuit 120 receives an incoming signal transition (e.g. a falling edge) of the reset signal S_RST, the oscillator circuit 120 starts to run or oscillate to generate the clock signal CLK with multiple signal edges at different timings.

In this embodiment, the delay units D1 and D2 may be regarded as a specific delay unit since the delay units D1 and D2 are connected in series. The NOR gate logic 1201 has a first input terminal, a second input terminal, and an output terminal. The first input terminal is coupled to the reset signal S_RST to receive the reset signal S_RST, the second input terminal is coupled to an output of the delay unit (s) (D1 and D2) to receive a delayed signal, and the output terminal is used to generate an output signal as the clock signal CLK to the input of the delay unit (s) (D1 and D2). The delay unit (s) (D1 and D2) is/are used to apply specific delay amount (s) upon the output signal CLK of the NOR gate logic 1201 to generate the delayed signal back to the second input terminal of the NOR gate logic 1201 to form the ring oscillator circuit's 120 structure.

Further, for example, the plurality of flip-flops FF1, FF2, . . . , and FFn connected in series are respectively used for generating the multiple bit conversion signals S<1>, S<1>, . . . , and S<n> (i.e. S<1:n>). Each flip-flop for example is a D-type flip-flop which has a clock input to receive the clock signal CLK, a data input ('D'), a reset/clear input ('RST') to receive the reset signal S_RST, an output ('Q'), and an inverted output ($\overline{Q}$, not shown in FIG. 1). Each D-type flip-flop's clock input is coupled to the clock signal CLK generated by the oscillator circuit 120, and its reset/clear input is coupled to the reset signal S_RST. The data input of the first one D-type flip-flop FF1 is coupled to a high logic level such as a supply voltage level Vdd, and the output of the first one flip-flop FF1 is coupled to the data input of a next-stage (or next one) D-type flip-flop FF2. The data input of an intermediate one D-type flip-flop is coupled to the output of a previous-stage D-type flip-flop, and the output of the intermediate one flip-flop is coupled to the data input of a next-stage (or next one) D-type flip-flop. The data input of the last one D-type flip-flop FFn is coupled to the output of a previous-stage D-type flip-flop, and the output of the last one flip-flop FFn is coupled to the DLL control circuit 1252. In addition, the outputs ('Q') of all the D-type flip-flops FF1-FFn are respectively used as the multiple bit conversion signals which are outputted to form the signal S<1:n> having N bits and transmitted to the SAR decision circuit 115. The number of the D-type flip-flops is equal to n.

Further, the first flip-flop FFA and second flip-flop FFB are for example (but not limited) D-type flip-flops. The data input of the first flip-flop FFA is coupled to the output of the last one D-type flip-flop FFn in the delay stage circuit 1251, its clock input is coupled to the clock signal CLK, its reset input is coupled to the reset signal S_RST, and its data output is used for generating a first guard signal S<n+1> and is coupled to the data input of the second flip-flop FFB. The data input of the second flip-flop FFB is coupled to the first guard signal S<n+1>, its clock input is coupled to the clock signal CLK, its reset input is coupled to the reset signal S_RST, and its data output is used for generating a second guard signal S<n+2> and is coupled to the up/down counter 1253 through the inverter INV1. The input of the inverter INV1 is coupled to the first guard signal S<n+1>, and its output is coupled to the up/down counter 1253. The inverter INV1 is used to invert the first guard signal S<n+1> to generate an inverted first guard signal $\overline{S<n+1>}$ to the up/down counter 1253.

The up/down counter 1253 is coupled to the reset signal S_RST, the inverted first guard signal $\overline{S<n+1>}$, and the second guard signal S<n+2>, and it is used for comparing the reset signal S_RST with the inverted first guard signal $\overline{S<n+1>}$ to generate a first decision signal (not shown in FIG. 1), comparing the reset signal S_RST with the second guard signal S<n+2> to generate a second decision signal (not shown in FIG. 1), generating the control signal S_C to control the delay TDAC generated by the delay unit D2 of the oscillator circuit 120 according to the first decision signal and the second decision signal.

Figure 2:
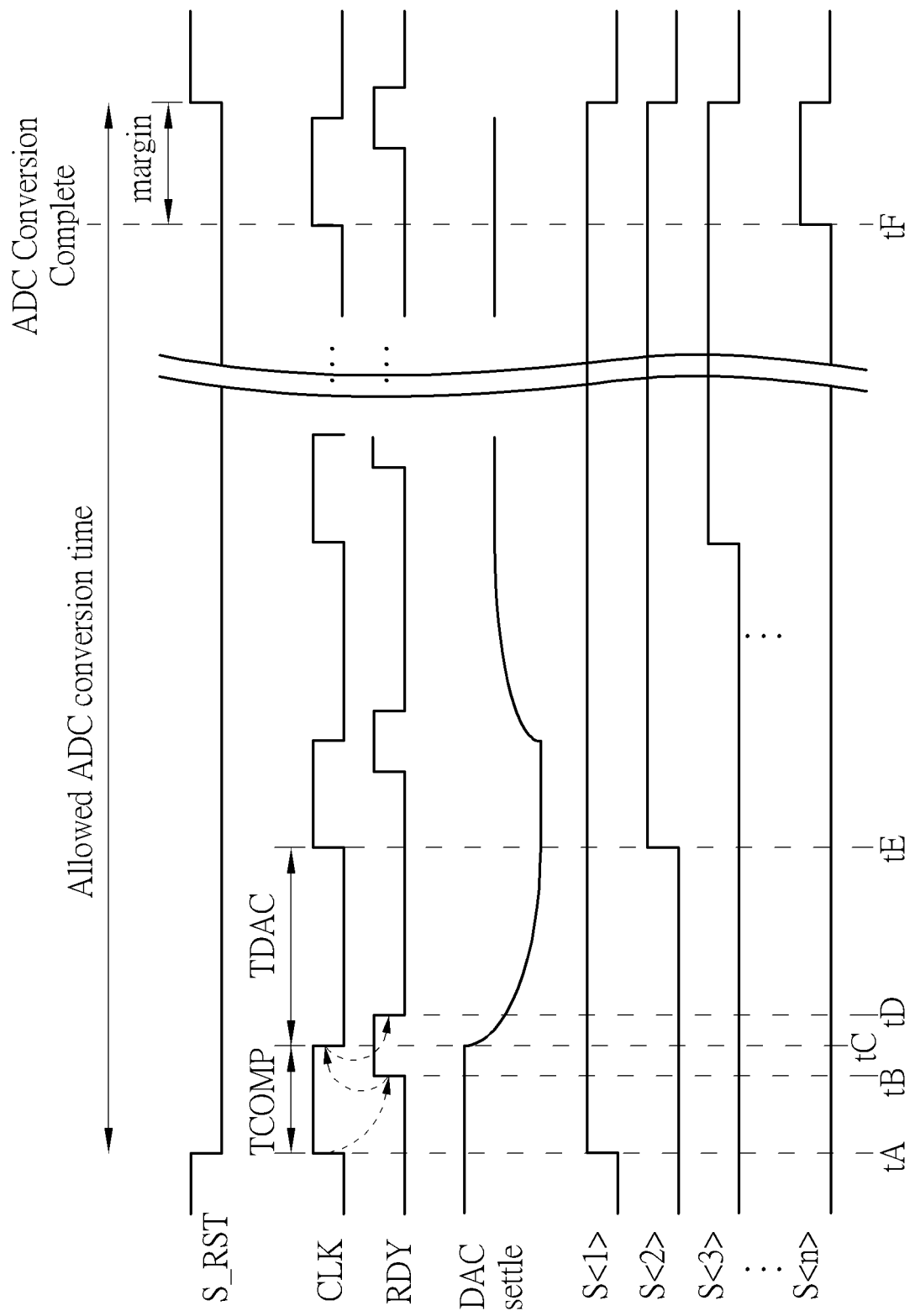
FIG. 2 is a diagram showing a scenario example of an ADC conversion time according to an embodiment of the invention.

FIG. 2 is a diagram showing a scenario example of an ADC conversion time according to an embodiment of the invention. In FIG. 2, the ADC conversion time can be allowed when the timing that the DAC circuit 105 has been settled is prior to the timing that the clock signal CLK goes to a high level at the next time and the multiple bit conversion cycles end and their level go to the high level before the reset signal S_RST switched from the low level to the high level. For example, for determining the MSB bit of the decision signal S_D, at time tA, the reset signal S_RST switched from the high level to the low level, and this event triggers the ring oscillator circuit 120 to run. In this situation, a rising edge occurs in the clock signal CLK, and also a rising edge occurs in the first bit conversion signal S<1> and it indicates that the bit conversion cycles for the MSB bit of decision signal S_D starts. The rising edge occurring in the clock signal CLK at time tA triggers the comparator circuit 110 in FIG. 1 to execute/perform the voltage comparison operation for one time for the current bit conversion cycle, i.e. MSB's bit conversion cycle.

Then, at time tB, when the comparator circuit 110 finishes the voltage comparison operation, the comparator circuit 110 outputs the comparison signal CMPO to the SAR decision circuit 115 and issues or transmits the read signal RDY with the high level to the delay unit D1. In this situation, a rising edge occurs in the read signal RDY.

For one or each bit conversion cycle, the delay unit D1 is configured to provide the delay amount TCOMP, which may be configured as a particular delay amount initially, and the delay unit D2 is configured to provide the delay amount TDAC which is adjustable and controlled by the processing circuit 125. The delay unit D1 is arranged to delay the rising edge of clock signal CLK with the delay amount TCOMP, and the read signal RDY causes that a transition, i.e. a falling edge, occurs in the clock signal CLK at time tC after the read signal RDY is sent to the delay unit D1 and the delay of delay unit D1 is elapsed. In this situation, at time tC, the voltage level provided by the DAC circuit 105 starts a transition. For example, it may be gradually lower down during the time period from time tC to time tE. The time tE means the timing that the bit conversion cycle of a different bit of the decision signal S_D starts.

In addition, the falling edge occurring in the clock signal CLK at time tC will cause that a falling edge occurs in the clock signal CLK at time tD. It is needed to finish the settling of DAC circuit 105 before a rising edge occurs in the clock signal CLK at time tE, and the delay unit D1 controlled by the processing circuit 125 is arranged to provide the delay amount TDAC to make and generate an appropriate and enough DAC settling time for the DAC circuit 105.

The bit conversion signals S<1>, S<2>, S<3>, . . . , and S<n> respectively indicate the bit conversion cycles of the different bits of the decision signal S_D, and their rising edges respectively indicate that the bit conversion cycles sequentially start one by one. It is required to make the LSB's bit conversion cycle, last performed, indicated by the signal S<n> starts prior to the time tF. That is, a specific margin is generated between the time tF and the end of an allowed whole time period of the ADC conversion time (i.e.

a rising edge of the reset signal S_RST). Also, the start of LSB's bit conversion cycle may indicate that the ADC conversion operation completes.

In this embodiment, to satisfy the requirement of the allowed ADC conversion time as well as precisely generate the converted digital code signal, the processing circuit 125 is arranged for providing and using the guard signal(s) such as S<n+1> (or $\overline{S<n+1>}$) and/or S<n+2>, controlling the delay (or delay amount) TDAC generated by the delay unit D2 of the oscillator circuit 120 to make a start of the first bit conversion signal S<1> associated with the first bit (e.g. the MSB) be close to a start (i.e. falling edge) of the reset signal S_RST and make a start of the at least one guard signal such as S<n+1> approach an end (i.e. rising edge) of the reset signal S_RST but not later than the end of the reset signal S_RST. The processing circuit 125 equivalently is arranged to control the delay TDAC so as to keep and make the end of the reset signal S_RST be later than a transition of the guard signal S<n+1> but not later than a transition of the guard signal S<n+2>. In addition, the processing circuit 125 is arranged for adjusting the delay TDAC generated by the delay unit D2 of the oscillator circuit 120 in response to a process variation, a voltage variation, or a temperature variation.

For example (but not limited), the ring oscillator circuit 120 may operate and run too fast or too slow due to the process variation, the voltage variation, and/or the temperature variation made to any component (s) comprised within the ADC device 100. This may cause that the start timings of the bit conversion cycles become too fast or too slow, and this affects the performance of ADC device 100. To solve or mitigate the problems caused by the process variation, the voltage variation, and/or the temperature variation, the processing circuit 125 employs the two guard signals S<n+1> and S<n+2> to simulate or emulate two additional bit conversion cycles sequentially following the bit conversion cycles of the above-mentioned n bits, and controls or tunes the delay TDAC of delay unit D2 to adjust the timings of the events of the two signal transition occurrences of the two additional bit conversion cycles, so as to make the rising edge of reset signal S_RST be at a timing between the event of a signal transition occurrence of a first additional bit conversion cycle and the event of a signal transition occurrence of a second additional bit conversion cycle. By doing this, the processing circuit 125 can make sure that time periods of the bit conversion cycles of the true bit conversion signals S<1>-S<n> can be enough and appropriate. This can effectively provide enough and appropriate bit conversion cycles for the n bits respectively.

Figure 3:
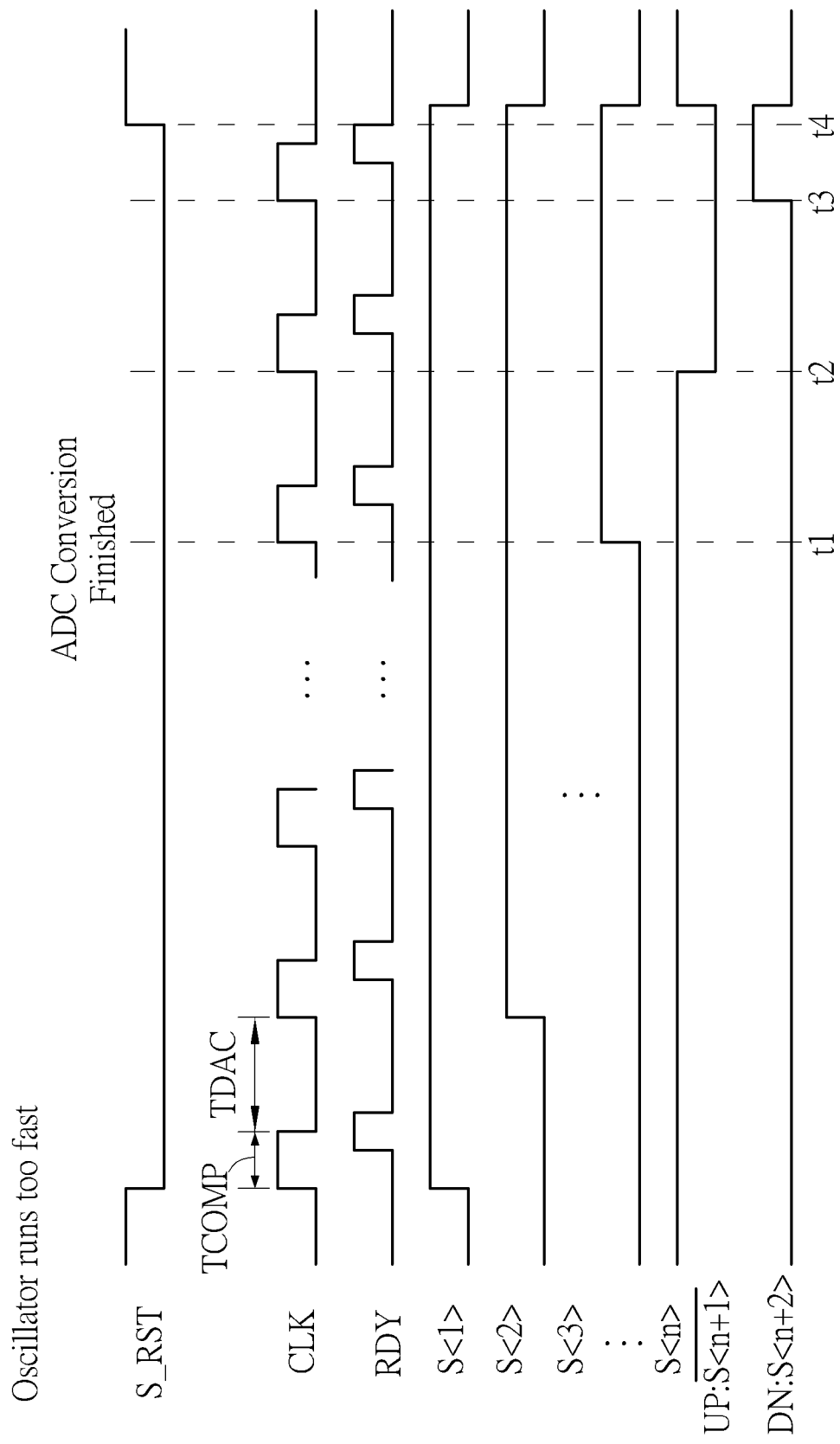
FIG. 3 is a diagram of a different scenario example of the ADC conversion time period according to another embodiment of the invention.

FIG. 3 is a diagram of a different scenario example of the ADC conversion time period according to another embodiment of the invention. In this scenario example, it is assumed that the ring oscillator circuit 120 may operate and run too fast. In FIG. 3, when a transition such as a rising edge occurs at time t1 in the last bit conversion signal S<n> corresponding to the LSB bit, this indicates that the ADC conversion operation is finished. In this example, a transition (such as a falling edge) of the inverted first guard signal $\overline{S<n+1>}$(i.e. a rising edge of the first guard signal S<n+1>) occurs at time t2, and a transition (such as a rising edge) of the second guard signal S<n+2>) occurs at time t3. The timing of the end (i.e. the rising edge) of reset signal S_RST, occurring at time t4, is later than the time t3. Thus, in this situation, when the inverted first guard signal $\overline{S<n+1>}$ is switched into the low level at time t2 and the reset signal S_RST is at the low level, the up/down counter 1253 compares the two signals, and the first decision signal generated by the up/down counter 1253 may be at the high level to indicate that the two signals are at the same level. For example, the first decision signal may be at the high level to indicate the same level and may be at the low level to indicate that the two signals are at different levels. Similarly, when the second guard signal S<n+2> is switched into the high level at time t3 and the reset signal S_RST is at the low level, the up/down counter 1253 compares the two signals, and the second decision signal generated by the up/down counter 1253 may be at the low level to indicate that the two signals are at different levels. For example, the second decision signal may be at the high level to indicate the same level and may be at the low level to indicate that the two signals are at different levels. In this example, the first decision signal (indicating the fast speed, 'UP') at the high level and the second decision signal (indicating the slow speed, 'DN') at the low level can be indicate that the oscillator circuit 120 runs too fast, and thus the processing circuit 125 can adjust the control signal S_C to tune the delay amount TDAC to lower down the operation speed of the oscillator circuit 120.

Figure 4:
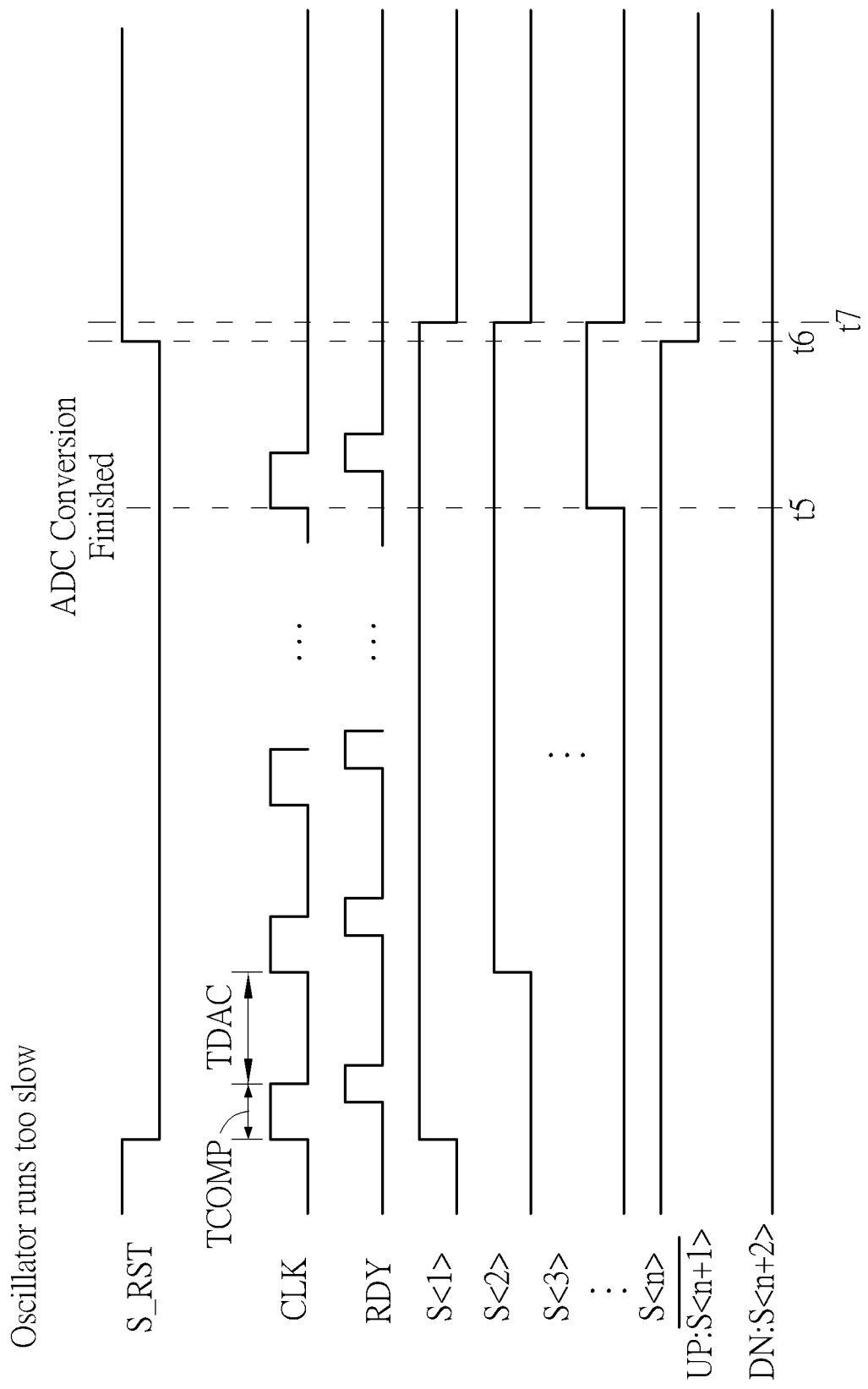
FIG. 4 is a diagram of a different scenario example of the ADC conversion time period according to another embodiment of the invention.

FIG. 4 is a diagram of a different scenario example of the ADC conversion time period according to another embodiment of the invention. In this scenario example, it is assumed that the ring oscillator circuit 120 may operate and run too slow. In FIG. 4, when a transition such as a rising edge occurs at time t5 in the last bit conversion signal S<n> corresponding to the LSB bit, this indicates that the ADC conversion operation is finished. In this example, the timing of the end (i.e. the rising edge) of reset signal S_RST occurs at time t6. A transition (such as a falling edge) of the inverted first guard signal $\overline{S<n+1>}$(i.e. a rising edge of the first guard signal S<n+1>) occurs at time t7 which is later than time t6. No transitions occur in the inverted first guard signal $\overline{S<n+1>}$ or in the second guard signal S<n+2> before the time t6.

In this example, since the inverted first guard signal $\overline{S<n+1>}$ is at the high level before time t6 and the reset signal S_RST is at the low level, the up/down counter 1253 compares the two signals, and the first decision signal generated by the up/down counter 1253 may be at the low level to indicate that the two signals are at different levels. In addition, since the second guard signal S<n+2> is at the low level and the reset signal S_RST is at the low level, the up/down counter 1253 compares the two signals, and the second decision signal generated by the up/down counter 1253 may be at the high level to indicate that the two signals are at the same level. In this example, the first decision signal (indicating the fast speed, 'UP') at the low level and the second decision signal (indicating the slow speed, 'DN') at the high level can be indicate that the oscillator circuit 120 runs too slow, and thus the processing circuit 125 can adjust the control signal S_C to tune the delay amount TDAC to increase or raise up the operation speed of the oscillator circuit 120. It should be noted that in the example of FIG. 4 the processing circuit 125 may determine that the oscillator circuit 120 is slow even through the rising edge of the last bit conversion cycle S<n> occurs before the rising edge of the reset signal S_RST since an enough margin time period should be guaranteed and in this example the margin time may be not enough. However, this is not intended to be a limitation of the invention.

Figure 5:
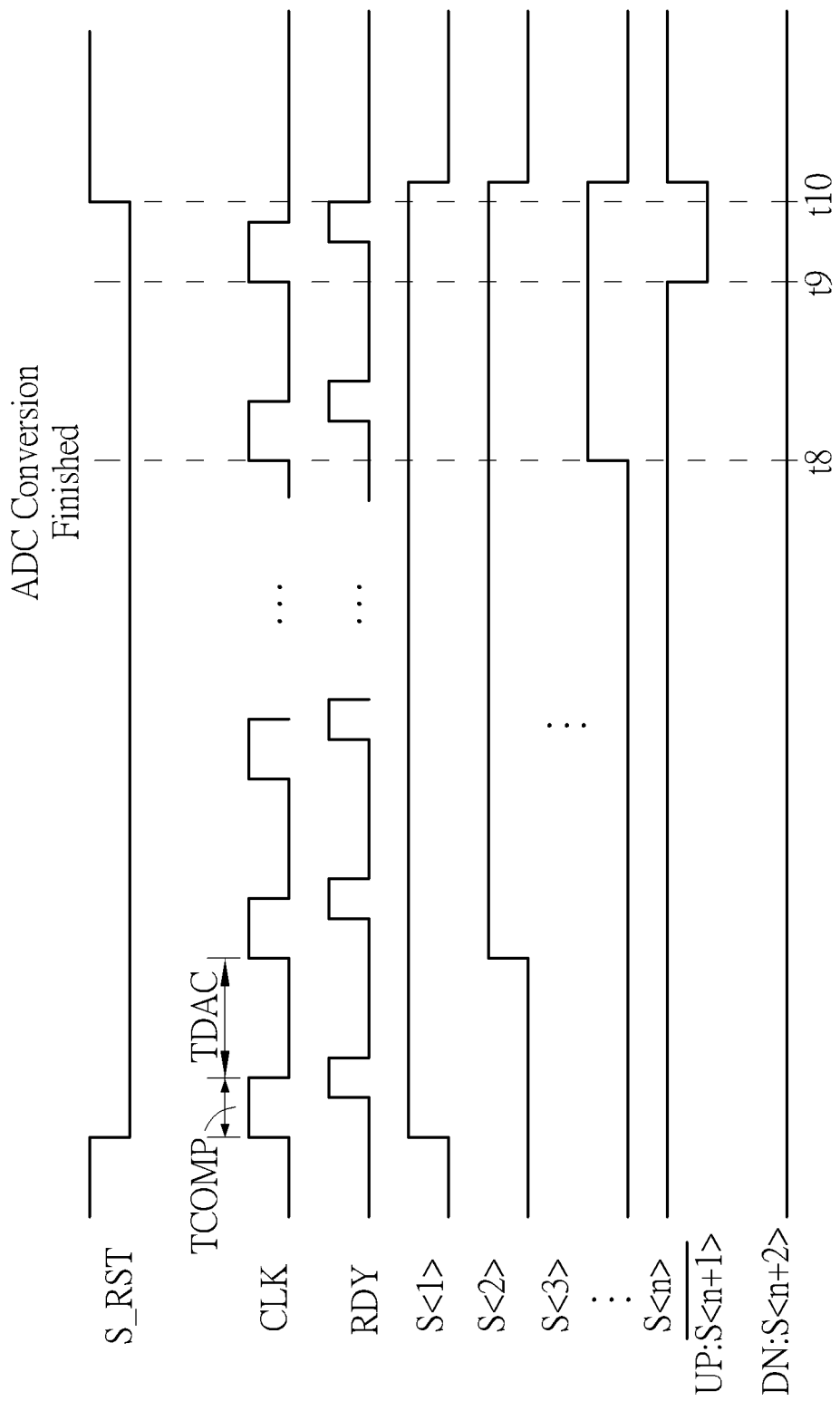
FIG. 5 is a diagram of a different scenario example of the ADC conversion time period according to another embodiment of the invention.

FIG. 5 is a diagram of a different scenario example of the ADC conversion time period according to another embodiment of the invention. In this scenario example, it is assumed that the ring oscillator circuit 120 may operate and run adequately. In FIG. 5, when a transition such as a rising edge occurs at time t8 in the last bit conversion signal S<n> corresponding to the LSB bit, this indicates that the ADC conversion operation is finished. In this example, a transition (such as a falling edge) of the inverted first guard signal $\overline{S\langle n+1\rangle}$ (i.e. a rising edge of the first guard signal S<n+1>) occurs at time t9, and the timing of the end (i.e. the rising edge) of reset signal S_RST occurs at time t10. No transitions occur in the second guard signal S<n+2> before the time t10.

In this example, when the inverted first guard signal $\overline{S\langle n+1\rangle}$ is switched into the low level at time t9 and the reset signal S_RST is at the low level, the up/down counter 1253 compares the two signals, and the first decision signal generated by the up/down counter 1253 may be at the high level to indicate that the two signals are at the same level. In addition, since the second guard signal S<n+2> is at the low level and the reset signal S_RST is at the low level before time t10, the up/down counter 1253 compares the two signals, and the second decision signal generated by the up/down counter 1253 may be at the high level to indicate that the two signals are at the same level. In this example, the first decision signal (indicating the fast speed, 'UP') at the high level and the second decision signal (indicating the slow speed, 'DN') at the high level can be indicate that the oscillator circuit 120 runs adequately and appropriately, and thus the processing circuit 125 is arranged to not adjust or tune the delay amount TDAC in this situation.

Figure 6:
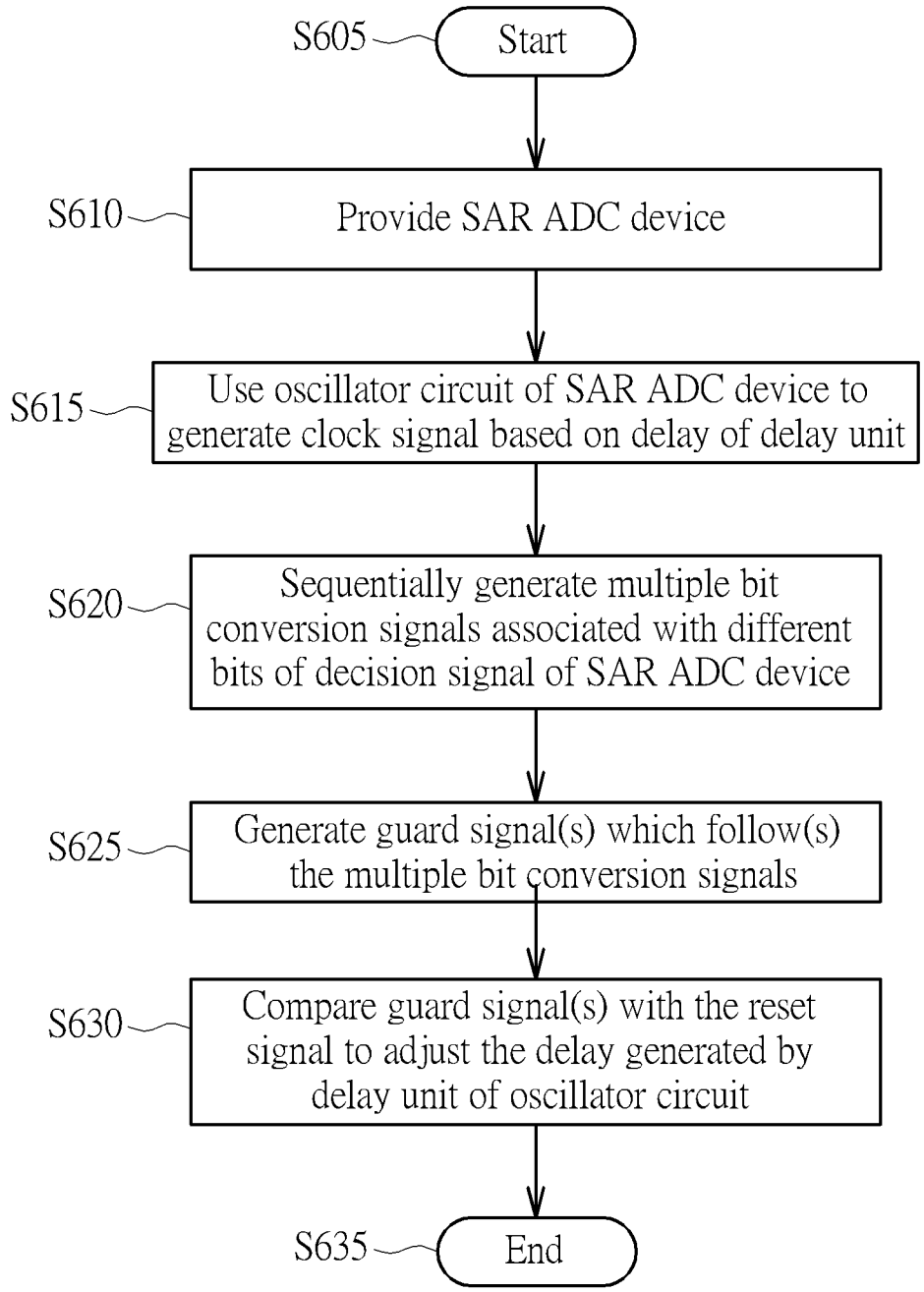
FIG. 6 is a schematic flowchart diagram of the adjusting operation of ADC device in FIG. 1 according to an embodiment of the invention.

To make readers more clearly understand the spirits of the invention, FIG. 6 is provided. FIG. 6 is a schematic flowchart diagram of the adjusting operation of ADC device 100 in FIG. 1 according to an embodiment of the invention. Provided that substantially the same result is achieved, the steps of the flowchart shown in FIG. 6 need not be in the exact order shown and need not be contiguous, that is, other steps can be intermediate. Steps are detailed in the following:

Step S605: Start;
Step S610: Provide the SAR ADC device 100;
Step S615: Use the oscillator circuit 120 of SAR ADC device 100 to generate the clock signal according to the reset signal S_RST and the delay of the delay unit;
Step S620: Sequentially generate multiple bit conversion signals associated with multiple different bits of the decision signal of SAR ADC device 100;
Step S625: Generate at least one guard signal which follows the multiple bit conversion signals;
Step S630: Compare the at least one guard signal with the reset signal S_RST to adjust the delay generated by the delay unit of the oscillator circuit 120; and
Step S635: End.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog-to-digital converter (ADC) device, comprising:
a digital-to-analog converter (DAC) circuit, having an input coupled to an input voltage signal and having an output coupled to a comparator circuit, for generating a DAC voltage signal according to the input voltage signal according to a decision signal transmitted from a successive approximation register (SAR) decision circuit;
the comparator circuit, having an input coupled to the DAC circuit, an output coupled to the SAR decision circuit, and a clock input coupled to a clock signal generated by an oscillator circuit, for generating a comparison signal into the SAR decision circuit according to the DAC voltage signal;
the SAR decision circuit, for generating the decision signal;
the oscillator circuit having a delay unit, coupled to the comparator circuit, for generating the clock signal according to a reset signal and a delay of the delay unit; and
a processing circuit, coupled to the oscillator circuit and the SAR decision circuit, for sequentially generating multiple bit conversion signals associated with multiple different bits of the decision signal, for generating at least one guard signal which follows the multiple bit conversion signals, and then for comparing the at least one guard signal with the reset signal to adjust the delay generated by the delay unit of the oscillator circuit.

2. The ADC device of claim 1, wherein the processing circuit comprises:
a delay stage circuit, for sequentially generating the multiple bit conversion signals according to the reset signal and the clock signal; and
a delay-locked-loop (DLL) control circuit, coupled to the delay stage circuit and the oscillator circuit, for generating the at least one guard signal by delaying a last bit conversion signal for at least one time, comparing the at least one guard signal with the reset signal to generate a control signal, and for controlling the delay generated by the delay unit of the oscillator circuit according to the control signal.

3. The ADC device of claim 2, wherein the delay stage circuit comprises:
a plurality of flip-flops connected in series and respectively generating the multiple bit conversion signals, each flip-flop having a clock input coupled to the clock signal generated by the oscillator circuit and having a reset input coupled to the reset signal.

4. The ADC device of claim 3, wherein the DLL control circuit 1252 comprises:
a first flip-flop, coupled to an output of a last flip-flop of the plurality of flip-flops, having a clock input coupled to the clock signal generated by the oscillator circuit, having a reset input coupled to the reset signal, and having an output for generating a first guard signal;
a second flip-flop, coupled to an output of the first flip-flop, having a clock input coupled to the clock signal generated by the oscillator circuit, having a reset input coupled to the reset signal, and having an output for generating a second guard signal; and
an up/down counter, coupled to the reset signal, the first guard signal, and the second guard signal, for comparing the reset signal with the first guard signal to generate a first decision signal, comparing the reset signal with the second guard signal to generate a second decision signal, generating the control signal to control the delay generated by the delay unit of the oscillator circuit according to the first decision signal and the second decision signal.

5. The ADC device of claim 1, wherein the processing circuit is arranged for controlling the delay generated by the delay unit of the oscillator circuit to make a start of a first bit conversion signal associated with a first bit be close to a start of the reset signal and make a start of the at least one guard signal approach an end of the reset signal.

6. The ADC device of claim 1, wherein the processing circuit is arranged for adjusting the delay generated by the delay unit of the oscillator circuit in response to a process variation, a voltage variation, or a temperature variation.

7. A method of an analog-to-digital converter (ADC) device, comprising:
provinding a digital-to-analog converter (DAC) circuit, the DAC circuit having an input coupled to an input voltage signal and having an output coupled to a comparator circuit;
generating a DAC voltage signal according to the input voltage signal according to a decision signal transmitted from a successive approximation register (SAR) decision circuit;
providing the comparator circuit, the comparator circuit having an input coupled to the DAC circuit, an output coupled to the SAR decision circuit, and a clock input coupled to a clock signal generated by an oscillator circuit;
generating a comparison signal into the SAR decision circuit according to the DAC voltage signal;
using the SAR decision circuit to generate the decision signal;
using the oscillator circuit to generate the clock signal according to a reset signal and a delay of the delay unit;
sequentially generating multiple bit conversion signals associated with multiple different bits of the decision signal;
generating at least one guard signal which follows the multiple bit conversion signals; and
comparing the at least one guard signal with the reset signal to adjust the delay generated by the delay unit of the oscillator circuit.

8. The method of claim 7, further comprising:
sequentially generating the multiple bit conversion signals according to the reset signal and the clock signal;
generating the at least one guard signal by delaying a last bit conversion signal for at least one time;
comparing the at least one guard signal with the reset signal to generate a control signal; and
controlling the delay generated by the delay unit of the oscillator circuit according to the control signal.

9. The method of claim 8, further comprising:
providing a plurality of flip-flops connected in series; and
respectively generating the multiple bit conversion signals based in the plurality of flip-flops;
wherein each flip-flop has a clock input coupled to the clock signal generated by the oscillator circuit and has a reset input coupled to the reset signal.

10. The method of claim 9, further comprising:
providing a first flip-flop, the first flip-flop being coupled to an output of a last flip-flop of the plurality of flip-flops, having a clock input coupled to the clock signal generated by the oscillator circuit, having a reset input coupled to the reset signal, and having an output for generating a first guard signal;
providing a second flip-flop, the second flip-flop being coupled to an output of the first flip-flop, having a clock input coupled to the clock signal generated by the oscillator circuit, having a reset input coupled to the reset signal, and having an output for generating a second guard signal;
comparing the reset signal with the first guard signal to generate a first decision signal;
comparing the reset signal with the second guard signal to generate a second decision signal; and
generating the control signal to control the delay generated by the delay unit of the oscillator circuit according to the first decision signal and the second decision signal.

11. The method of claim 7, further comprising:
controlling the delay generated by the delay unit of the oscillator circuit to make a start of a first bit conversion signal associated with a first bit be close to a start of the reset signal and make a start of the at least one guard signal approach an end of the reset signal.

12. The method of claim 7, further comprising:
adjusting the delay generated by the delay unit of the oscillator circuit in response to a process variation, a voltage variation, or a temperature variation.

* * * * *